United States Patent
Veches et al.

(10) Patent No.: US 12,424,259 B2
(45) Date of Patent: Sep. 23, 2025

(54) TECHNIQUES FOR FLEXIBLE SELF-REFRESH OF MEMORY ARRAYS

(71) Applicant: Micron Technology, Inc., Boise, ID (US)

(72) Inventors: Anthony D. Veches, Boise, ID (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 18/202,149

(22) Filed: May 25, 2023

(65) Prior Publication Data

US 2023/0395116 A1 Dec. 7, 2023

Related U.S. Application Data

(60) Provisional application No. 63/348,322, filed on Jun. 2, 2022.

(51) Int. Cl.
*G11C 11/00* (2006.01)
*G11C 11/406* (2006.01)

(52) U.S. Cl.
CPC .................. *G11C 11/406* (2013.01)

(58) Field of Classification Search
CPC ........ G11C 11/40622; G11C 11/40618; G11C 11/40615; G11C 11/40611; G11C 11/406; G11C 11/40603; G11C 11/4085; G11C 11/4087; G11C 2211/4065; G11C 2211/4068; G11C 7/02; G11C 7/24; G11C 11/4091; G11C 11/401; G11C 2211/4061; G11C 2211/4062; G11C 29/42; G11C 7/1006; G11C 7/1072; H01L 2224/16225; H01L 2224/48091; H01L 2224/48227; H01L 2224/4824; H01L 2225/0651; H01L 2225/06513; H01L 2225/06527; H01L 2225/06541; H01L 25/18; H01L 2924/00014; H01L 2924/15311
USPC ......................................... 365/222
See application file for complete search history.

(56) References Cited

U.S. PATENT DOCUMENTS 10,790,005 B1 * 9/2020 He .................... G11C 11/40603

* cited by examiner

*Primary Examiner* — Thong Q Le
(74) *Attorney, Agent, or Firm* — Holland & Hart LLP

(57) ABSTRACT

Methods, systems, and devices for techniques for flexible self-refresh of memory arrays are described. A memory system may set a respective refresh region for each respective memory bank of the memory system by tracking access to memory row addresses in respective memory banks used in the respective memory banks. For example, the memory system may monitor respective access commands issued to each respective memory bank and store information in a register of each respective memory bank. The memory system may determine whether a respective memory row address associated with a respective access command is within the respective refresh region and process the respective memory bank. The memory system may update a value stored in a register of the respective memory bank (e.g., a memory row address value) to adjust the refresh region of the respective memory bank without updating refresh regions for other memory banks in the memory system.

19 Claims, 6 Drawing Sheets

TECHNIQUES FOR FLEXIBLE SELF-REFRESH OF MEMORY ARRAYS

CROSS REFERENCE

The present application for patent claims the benefit of U.S. Provisional Patent Application No. 63/348,322 by Veches et al., entitled "TECHNIQUES FOR FLEXIBLE SELF-REFRESH OF MEMORY ARRAYS," filed Jun. 2, 2022, assigned to the assignee hereof, and expressly incorporated by reference herein.

FIELD OF TECHNOLOGY

The following relates to one or more systems for memory, including techniques for flexible self-refresh of memory arrays.

BACKGROUND

Memory devices are widely used to store information in various electronic devices such as computers, user devices, communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
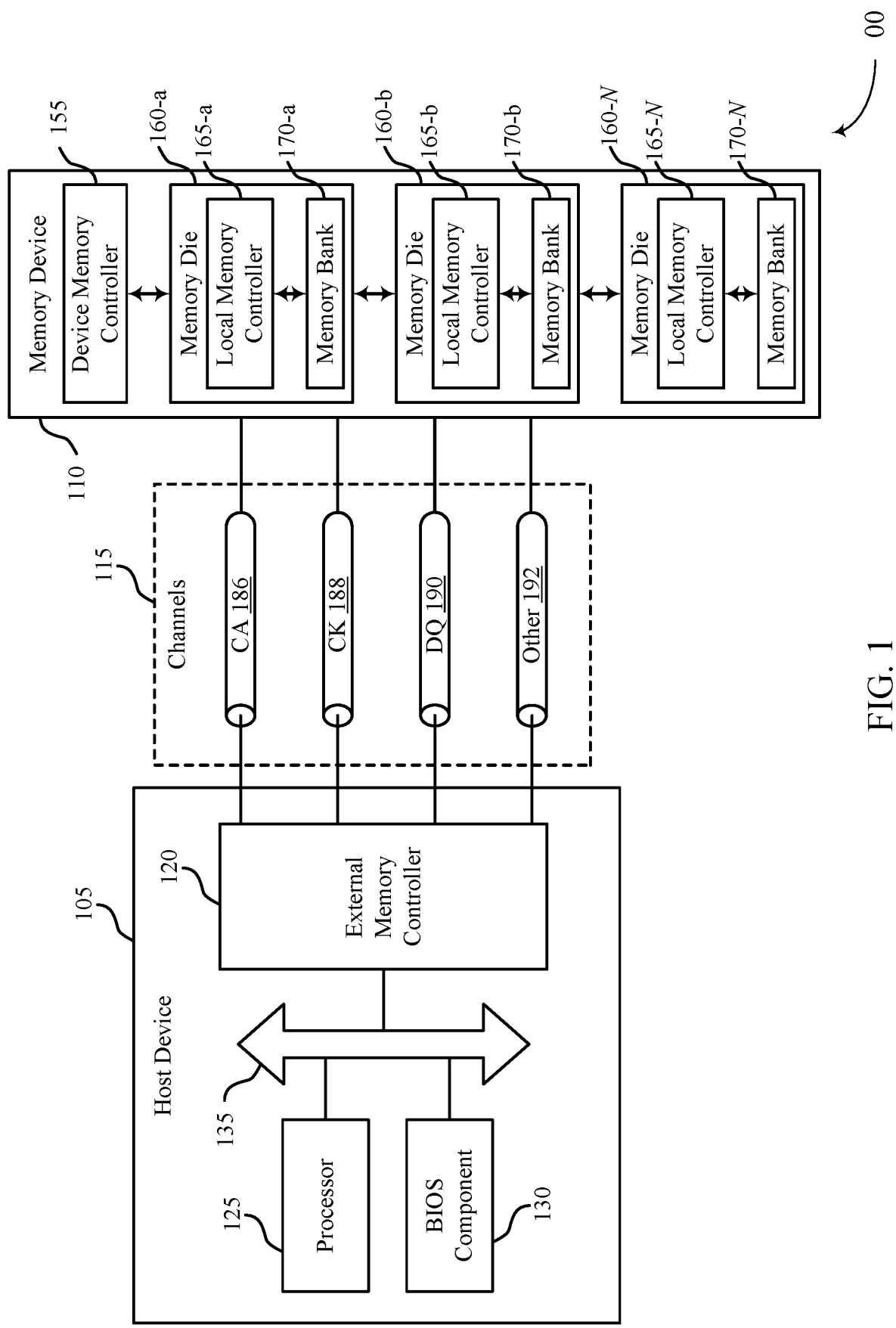
FIG. 1 illustrates an example of a system that supports techniques for flexible self-refresh of memory arrays in accordance with examples as disclosed herein.

A memory device may support various operations and may be operable to execute commands, such as storing data, retrieving the stored data, or refreshing the stored data, among other examples. The memory device may be configured with a set of memory banks (e.g., one or more memory banks), in which the memory device may store data and retrieve the stored data. In some cases, electrical current may leak from a capacitor storing data in a memory bank over time, and the memory device may support refresh operations for the set of memory banks to maintain data integrity. For example, a memory device, such as a dynamic read-only memory (DRAM) device, may be configured for a partial array self-refresh (PASR) operation for a set of memory banks, which operation may refresh a respective portion of each memory bank of the set of memory banks. In some cases, the memory device may be configured (or preconfigured) to set a refresh region that corresponds to the respective portion of each memory bank of the set of memory banks by storing a value in a register (e.g., a mode register). As such, the memory device may perform refresh operations on memory row addresses in the refresh region and skip (e.g., reject) refresh operations on other memory row addresses. The refresh region and the respective portion of each memory bank are configured to be the same. However, using the register to set a same refresh region for each memory bank may result in suboptimal refresh operations (e.g., PASR operations) because the refresh region may be larger that is required and having the same refresh region for each memory bank may cause overprovisioning for the PASR operations, which may also cause suboptimal power consumption at the memory device. To eliminate suboptimal refresh operations and increase power savings for the memory device, the memory device may be configured to set a respective refresh region (e.g., a different respective refresh region) for each respective memory bank by tracking memory row addresses used in the respective memory bank based on monitoring respective activate commands issued to each respective memory bank and storing information (e.g., in a register) of each respective memory bank.

Various aspects of the present disclosure relate to a memory device tracking accesses to memory row addresses for each memory bank of a set of memory banks and determining a respective refresh region for each memory bank based on the tracking of accesses to the memory row addresses for each memory bank. For example, the memory device may monitor received (e.g., from a host system) activate commands (e.g., a write or access command) indicating a memory row addresses in a memory bank. Accordingly, the memory device may track accessed memory row addresses to maintain the respective refresh regions for each memory bank. For example, the memory device may determine that a memory row address to be accessed is outside the respective refresh region of the accessed memory bank and set (e.g., update) a value (e.g., a minimum or maximum memory row address value) stored in a register associated with the memory bank to increase the refresh region of the memory bank, without updating other refresh regions for other memory banks in the memory device. The memory device may thereby determine respective refresh regions for each respective memory bank of the memory banks in the memory device. As the memory device receives one or more refresh commands (e.g., PASR commands), the memory device may compare the memory row addresses against respective refresh regions of respective memory banks. In some cases, the memory device may receive a reset command (e.g., from a host device) and update the refresh region in response to the command. For example, a host device may determine that data in a memory bank is no longer in use and send a reset command indicating the memory device to update the refresh region to an unused state containing no memory row addresses. Additionally, a reset command may be apply to all of memory banks simultaneously or may be memory bank specific using either a command based or mode register operation. Accordingly, the memory device may avoid performing unnecessary refresh operations and increase power savings associated with various refresh related commands including refresh, self-refresh, automatic refresh, manual refresh, and PASR operations, among other advantages.

Features of the disclosure are initially described in the context of systems and dies as described with reference to FIGS. 1 and 2. Features of the disclosure are described in the context of memory systems and signaling diagrams as described with reference to FIGS. 3 and 4. These and other features of the disclosure are further illustrated by and described with reference to an apparatus diagram and flowcharts that relate to techniques for flexible self-refresh of memory arrays as described with reference to FIGS. 5 and 6.

FIG. 1 illustrates an example of a system 100 that supports techniques for flexible self-refresh of memory arrays in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and memory banks 170 (e.g., memory banks 170-a, memory banks 170-b, memory banks 170-N). Memory banks 170 may be a collection (e.g., one or more grids, one or more banks, one or more tiles, one or more sections) of memory cells, with each memory cell being operable to store one or more bits of data.

A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

The memory device 110 may receive a refresh command (e.g., a self-refresh command) from the host device 105 indicating the memory device 110 to refresh one or more memory row addresses, which may be referred to as refresh memory row addresses. In some cases, the memory device 110 may define (e.g., assign) a region of a memory bank of memory banks 170 as a refresh region (e.g., related to memory row addresses with valid stored data). For example, the memory device 110 may store one or more memory row addresses in a register of the memory bank to define a range (e.g., a low boundary and a high boundary) for the refresh region. The memory device 110 may perform a refresh operation on the refresh memory row addresses (e.g., associated with the memory bank of memory banks 170) that are within the refresh region, while skipping (e.g., rejecting) the refresh operation for other memory row addresses that are not within the refresh region (e.g., outside the refresh region). However, in some cases, defining a single refresh region for more than one memory bank of memory banks 170 (e.g., one or more memory banks of memory bank 170-*a*) may result in the memory device 110 refreshing memory row addresses that do not have stored data (e.g., not currently in use or not accessed since power-up of the memory device 110) and perform unnecessary refresh operations. For example, the memory device 110 may refresh a region of one or more memory banks of the memory banks 170-*a* that does not have any stored data. In accordance with examples disclosed herein, the memory device 110 may perform operations relating to maintaining an independent refresh region for each memory bank of memory banks 170 in the memory device 110.

The memory device 110 may monitor (e.g., through a local memory controller 165) access operations performed on a memory bank of memory banks 170 in order to determine and update a refresh region for the memory bank. For example, the memory device 110 may receive (e.g., from the host device 105) an access (e.g., a write, activate, etc.) command indicating a memory row address in a respective memory bank of memory banks 170. The memory device 110 may determine that the memory row address is within or outside of a respective refresh region associated with the respective memory bank and update a respective value defining the respective refresh region (e.g., a minimum or maximum address value) of the memory bank stored in a register associated with the memory bank without updating other refresh regions for other memory banks of memory banks 170 in the memory device 110. The register may be a mode register such as an extended mode registers set (EMRS), and, in some cases, each respective memory bank of memory banks 170 may store the register within one or more memory cells of the respective memory bank. The memory device 110 may thereby track memory row address values for defining multiple independent refresh regions corresponding to each memory bank of memory banks 170 in the memory device 110.

The memory device 110 may retrieve the value stored in the register associated with a memory bank of memory banks 170 in response to a received refresh command indicating the memory bank to be refreshed. The memory device 110 may compare the memory row addresses to be refreshed with the retrieved value and process the refresh command based on the comparison. For example, the memory device 110 may execute the refresh command on memory row addresses determined to be within the refresh region of the memory bank (e.g., memory row addresses less than or equal to a retrieved maximum memory row address). Similarly, the memory device 110 may reject (e.g., skip) performing the refresh command on memory row addresses determined to be outside the refresh region of the memory bank (e.g., memory row addresses unequal to and greater than the retrieved maximum memory row address).

Figure 2:
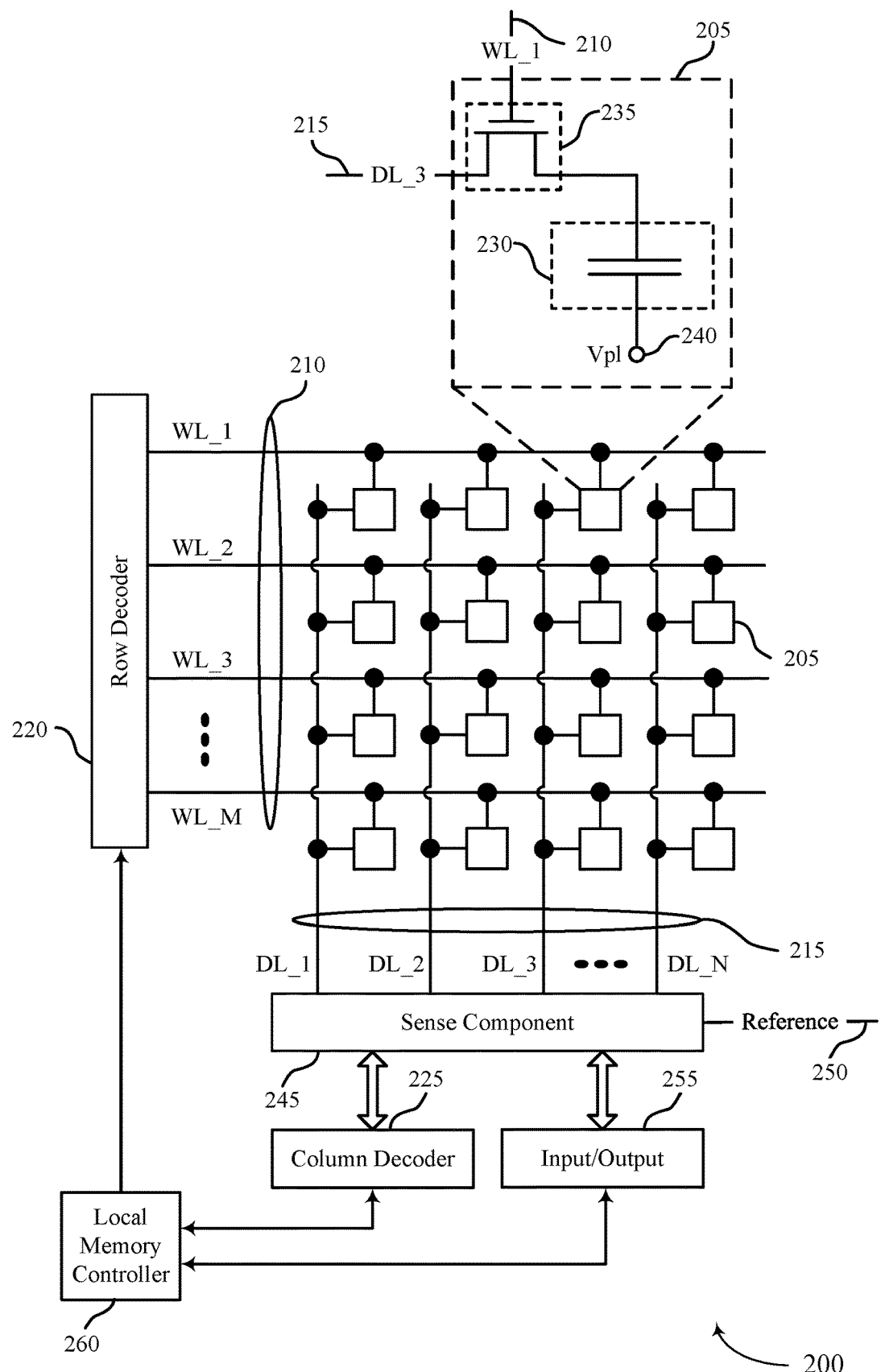
FIG. 2 illustrates an example of a memory die that supports techniques for flexible self-refresh of memory arrays in accordance with examples as disclosed herein.

FIG. 2 illustrates an example of a memory die 200 that supports techniques for flexible self-refresh of memory arrays in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory bank 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

The local memory controller 260 may be operable to perform a refresh operation (e.g., a PASR operation) on one or more memory cells 205 of the memory die 200. In some examples, refreshing a memory cell 205 may include performing a read operation on the memory cell 205 to determine a logic state stored of the memory cell 205, and subsequently performing a write operation to store the determined logic state in the capacitor of the 230 of the memory cell 205. A memory row address may point to a word line 210 (e.g., a row) of the memory die 200, and performing a refresh operation on a memory row address may involve refreshing each memory cell 205 located along the word line 210 associated with the memory row address. As described herein, the memory controller 260 may be operable to set a refresh region associated with a respective subset of the memory cells 205 by storing a value in a register (e.g., a mode register). The memory controller 260 may perform a refresh operation on memory row addresses associated with the respective subset of the memory cells 205 based on the refresh region, while refraining from performing the refresh operation (e.g., skipping) on the other subset of the memory cells 205 associated with memory row addresses that are not within the refresh region.

As described herein, the memory controller 260 may be operable to track memory row accesses associated with the memory cells 205 and define (e.g., set) the refresh region for the memory die 200 based on the tracking of the memory row accesses associated with the memory cells 205. By tracking the memory row accesses associated with the memory cells 205, the memory controller 260 may define a refresh region that includes memory cells 205 of the memory die 200 that are being used (e.g., storing data) and exclude other memory cells 205 of the memory die 200 that are not being used. The memory controller 260 may set a value in a register that defines the refresh region. The memory controller 260 may be configured to continuously determine and update the refresh region for the memory die 200, and thereby avoid performing unnecessary refresh operations on memory cells 205 of the memory die 200 that are not being used.

Additionally, or alternatively, the memory controller 260 may be operable to perform a reset operation corresponding to a refresh region of the memory die 200. The memory controller 260 may update a value of the register (e.g., the minimum or maximum memory row address value) of the memory die 200 according to the reset operation. For example, the memory controller 260 may set the register to a null value, a zero value, or a lowest value of a memory row address of the memory die 200. Accordingly, the memory controller 260 may return the refresh region to an unused state, so that refresh operations are rejected until further access operations are performed for the memory die 200.

Figure 3:
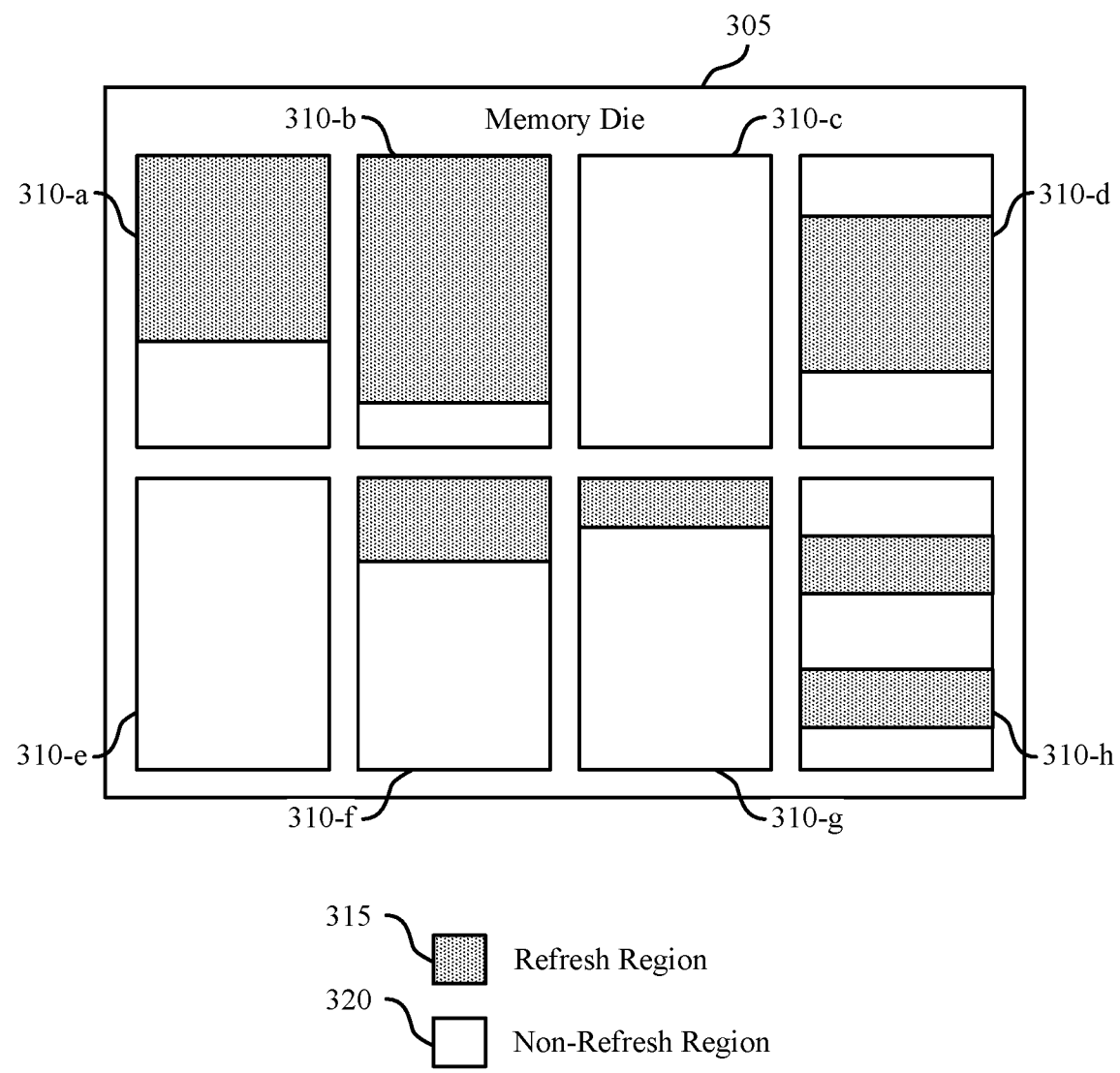
FIG. 3 illustrates an example of a memory system that supports techniques for flexible self-refresh of memory arrays in accordance with examples as disclosed herein.

FIG. 3 illustrates an example of a memory system 300 that supports techniques for flexible self-refresh of memory arrays in accordance with examples as disclosed herein. The memory system 300 may implement aspects of the system 100 or may be implemented by aspects of the system 100 as described with reference to FIG. 1. For example, the memory system 300 may be implemented by or in conjunction with a memory die 305. Additionally, or alternatively, the memory system 300 may implement aspects of the memory die 200 or may be implemented by aspects of the memory die 200 as described with reference to FIG. 2. The memory die 200 may be an example of the memory dies 160 described with reference to FIG. 1. In some examples, the memory die 200 may be referred to as a memory chip, a memory device, or an electronic memory apparatus. The memory die 200 may contain one or more memory banks 310, such as a memory bank 310-a, a memory bank 310-b, a memory bank 310-c, a memory bank 310-d, a memory bank 310-e, a memory bank 310-f, 310-g, and a memory bank 310-h.

The memory die 305 may maintain a record of (e.g., may store) memory addresses (e.g., memory row addresses) that are in use in each memory bank 310 by monitoring access (e.g., activate, write, etc.) commands issued for each respective memory bank 310. The record may be used to define a refresh region 315 within each memory bank 310. For example, the memory die 305 may store a memory row address, such as a maximum memory row address, in a register (e.g., a mode register, which may be an extended register) within a memory bank 310-a to define a range (e.g., a highest memory row address, upper boundary, etc.) for a refresh region 315 from a first memory row address within the memory bank 310-a (e.g., zero) and the maximum memory row address. In some cases, the memory die 305 may additionally store another memory row address, such as a minimum memory row address (e.g., a lowest memory row address, lower boundary, etc.) in a register within a memory bank 310-d to define a range for a refresh region 315 of the memory bank 310-d from the minimum memory row address to the maximum memory row address. In some examples, the memory die 305 may store multiple memory row addresses (e.g., multiple maximum and minimum memory row addresses) within a register (e.g., a mode register) within a memory bank 310-h to form multiple non-contiguous ranges for a refresh region 315 of a memory bank 310-h. A range in a refresh region may be defined as one or more consecutive memory row addresses, which may refer to memory row addresses corresponding to memory cells that are stored sequentially (e.g., adjacently) in the memory bank 310-h. Additionally, or alternatively, the memory die 305 may store an indication of individual memory row addresses that are accessed as to allow for a refresh region 315 consisting of individual, nonconsecutive memory row addresses in a memory bank 310-h. Nonconsecutive memory row addresses may refer to memory row addresses associated with memory cells that are stored non-sequentially in the memory bank 310-h. In some examples, the memory die 305 may store a record of individual memory row addresses that are indicated in access commands (e.g., within one or more registers).

The memory die 305 may set refresh regions 315 during operation. For example, the memory die 305 may receive an access operation (e.g., from a host device) associated with (e.g., including, indicating, comprising, etc.) a memory row address within a memory bank 310. This may indicate to the memory die 305 that the memory row address within the memory bank 310 is in use, and the data stored at the memory row address should be refreshed during, for example, a partial array self-refresh (PASR) operation. In some cases, the memory die 305 may consider all memory banks 310 as unused after start-up, so all ranges corresponding to refresh regions 315 may be empty (e.g., zero, contain no memory row addresses, etc.). Alternatively, the refresh regions 315 may start with predefined (e.g., configured, or preconfigured) boundaries. As the memory die 305 receives access (e.g., write, activate, etc.) commands corresponding to a memory bank 310, the memory die 305 may set (e.g., initially set, update) the refresh region 315 of the memory bank 310 to include memory row addresses associated with the access commands not within the refresh region 315.

The memory die 305 may determine whether a memory row address associated with a received access command is within a refresh region 315 of a corresponding memory bank 310 by comparing the memory row address with values defining the boundaries of the refresh region 315. For example, the memory die 305 may compare the memory row address with another memory row address, such as a maximum memory row address, retrieved from a register of the memory bank 310 corresponding to the refresh region 315. If the memory die 305 determines that the memory row address is greater than the maximum memory row address stored in the register, the memory die 305 may store the memory row address associated with the access command in the register so that the boundary of the refresh region 315 is increased to include the memory row address.

In some examples, the memory die 305 may compare the memory row address with a minimum memory row address retrieved from the register of the memory bank 310. For example, if the memory die 305 determines that the memory row address is less than the minimum memory row address stored in the register, the memory die 305 may store the memory row address associated with the access command in the register, so that the lower boundary of the refresh region 315 is decreased to include the memory row address. In some examples, such as those where a refresh region 315 contains multiple non-contiguous ranges, the memory die 305 may perform these comparisons for each of the ranges and expand one of the ranges if the memory row address is determined to be outside of the refresh region 315.

The memory die 305 may receive a refresh command indicating a memory row address to be refreshed corresponding to a memory bank 310. The memory die 305 may utilize the values stored in the register of the memory bank 310 to selectively perform a refresh operation if the memory row addresses that is determined to be within a refresh region 315 of the memory bank 310. For example, the memory die 305 may compare a memory row address with the maximum memory row address value stored in a register of the memory bank 310. If the memory row address is greater than the maximum memory row address, the memory die 305 may skip (e.g., reject) the refresh command issued on the memory row address.

Alternatively, if the memory row address is less than or equal to the maximum memory row address, the memory die 305 may execute the refresh command on the memory row address. In cases where the memory die 305 has stored a minimum memory row address in the register of the memory bank 310, the memory device may also check that the memory row address is greater than or equal to the minimum memory row address stored in the register before executing the refresh command. Additionally, or alternatively, in cases where the memory die 305 has stored multiple minimum and maximum memory row addresses corresponding to more than one ranges for the refresh region 315, the memory die 305 may check if the memory row address is between the minimum and maximum memory row address of each range until each range is checked or the memory row address is determined to be in one of the ranges. If the memory die 305 finds that the memory row address is within a range, it may execute the refresh command on the memory row address. Alternatively, if the memory die 305 confirms that the memory row address is not within any of the ranges associated with the refresh region 315, the memory die 305 may skip (e.g., reject) the refresh command.

The memory die 305 may receive a refresh command (e.g., as part of a PASR operation) indicating the memory die 305 to perform a refresh operation on multiple memory row addresses located in a memory banks 310. The refresh command may indicate memory row addresses to be refreshed to the memory die 305, or it may indicate to the memory die 305 to perform a refresh on all memory row addresses of the memory bank 310, for example. In response to the command, the memory die 305 may perform refresh operations on memory row addresses that are within the refresh region 315 of the one or more memory banks 310. Additionally, the memory die 305 may refrain from refreshing memory row addresses within a memory bank 310 that are within a non-refresh region 320.

In response to the refresh command indicating multiple memory row addresses, the memory die 305 may check whether each individual memory row address is located within the refresh region 315 by comparing the memory row address with the values in the register of the corresponding memory bank 310 and execute or skip a refresh operation for the memory row address accordingly. The memory die 305 perform this process for each memory row address pointed by a refresh counter, which may iterate through the memory row addresses to be refreshed. Alternatively, the memory die 305 may, for each memory bank 310, form a first group of (e.g., consecutive) memory row addresses that are within the refresh region 315 of the respective memory bank 310 and a second group of (e.g., consecutive) memory row addresses that are within the non-refresh region 315 of the memory bank 310 in response to the refresh command. For example, the memory die 305 may compare the multiple memory row addresses to be refreshed with the maximum memory row address stored in the register of the corresponding memory bank. The first group of memory row addresses may be the memory row addresses indicated to be refreshed that are less than or equal to the maximum memory row address in the register, while the second group may be the memory row addresses indicated to be refreshed that are greater than the maximum memory row address.

In some examples, the groups may be further refined by comparing the multiple memory row addresses with a minimum memory row address stored in the register of the corresponding memory bank. Additionally, or alternatively, the groups may be formed by checking if the memory row addresses to be refreshed are within one of multiple (e.g., non-contiguous) ranges defining the refresh region 315. The memory die 305 may execute refresh operations on the first group of memory row addresses, and refrain from executing refresh operations on (e.g., skip) the second group of memory row addresses. In some examples, the memory die 305 may mask memory row addresses within the non-refresh region 320 to avoid a refresh operation being executed on memory row addresses within the non-refresh region 320.

The memory die 305 may receive a command (e.g., from a host device) to set a register (e.g., a mode register) corresponding to one or more of the memory banks 310 to an indicated value. For example, the command may indicate a value and a memory bank 310, so that a value stored within the register of the memory bank 310 is set to the indicated value. Thus, the refresh region 315 may be modified (e.g., expanded or shortened) according to the received command. The command may indicate values corresponding to a maximum memory row address for the refresh region 315, the minimum memory row address for the refresh region 315, multiple values corresponding to boundaries for a range within a refresh region 315, or a combination thereof.

In some cases, the memory die 305 may receive a reset command (e.g., from a host device) indicating the memory die 305 to return one or more memory banks 310 to an unused state. For example, in response to the reset command, the memory die 305 may set the register storing the maximum memory row address for the refresh region 315 of a memory bank 310 to a null value. In some cases, the register may instead be set to a zero value, a value lower than any memory row address of the memory bank 310, a predefined (e.g., configured, or preconfigured) value, etc. In some examples, the reset command may indicate the memory die 305 to set all memory banks 310 of the memory die 305 to the unused state, for example, during start-up operations. Alternatively, the reset command may indicate the memory die 305 to set a single memory bank 310 to an unused state, for example, using a command based or mode register operation.

Figure 4:
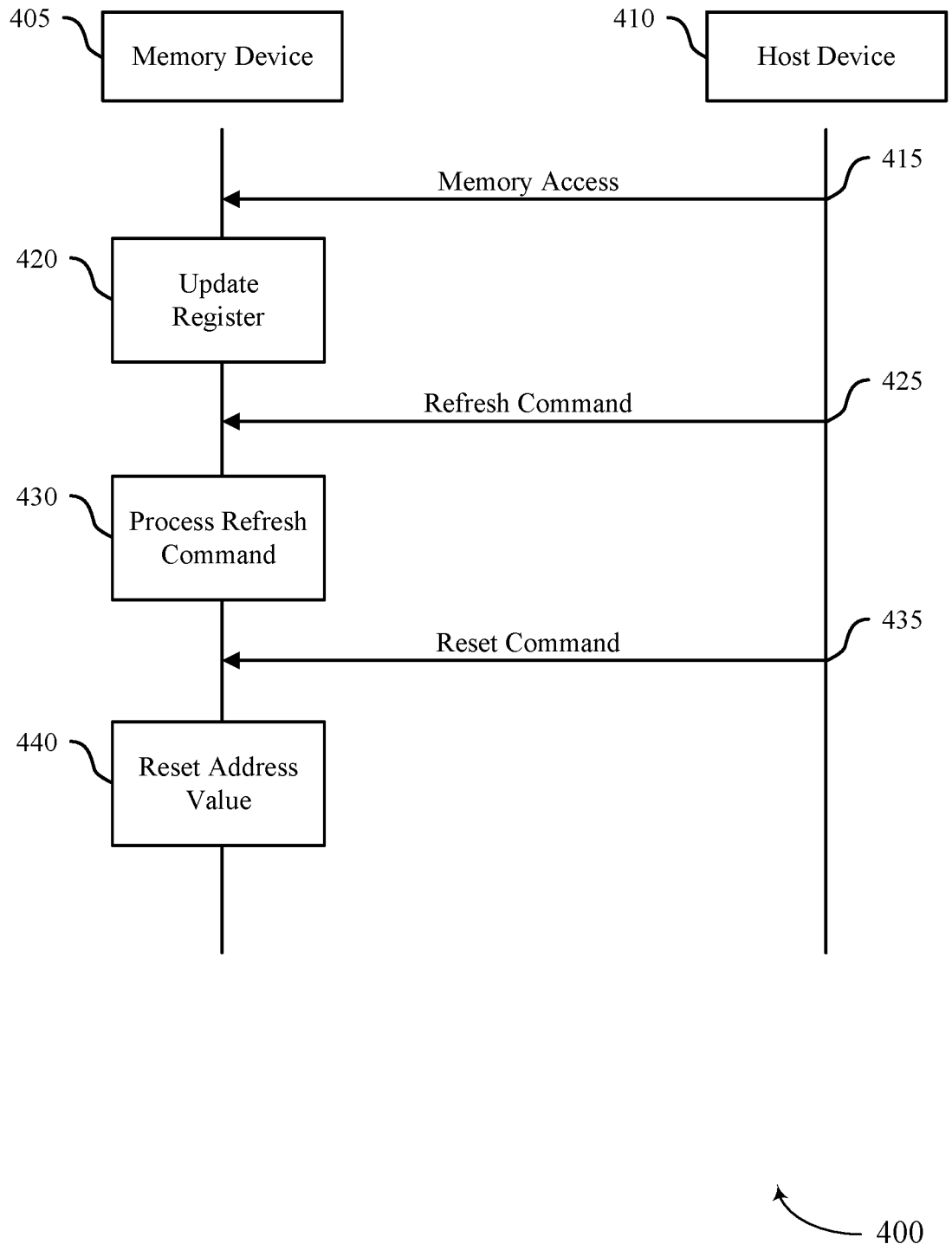
FIG. 4 illustrates an example of a signaling diagram that supports techniques for flexible self-refresh of memory arrays in accordance with examples as disclosed herein.

FIG. 4 illustrates an example of a signaling diagram 400 that supports techniques for flexible self-refresh of memory arrays in accordance with examples as disclosed herein. The signaling diagram 400 may implement aspects of the system 100 or may be implemented by aspects of the system 100 as described with reference to FIG. 1. For example, the signaling diagram 400 may be implemented by a host device 105 or a memory device 110. One or both of the host device 410 or the memory device 405 may be examples of a host device 105 or a memory device 110 as described with reference to FIG. 1. Additionally, or alternatively, the signaling diagram 400 may implement aspects of the memory die 200 or may be implemented by aspects of the memory die 200 as described with reference to FIG. 2. The memory die 200 may be an example of the memory dies 160 described with reference to FIG. 1. In some examples, the memory die 200 may be referred to as a memory chip, a memory device, or an electronic memory apparatus. In the following description of the signaling diagram 400, the operations between one or both of the memory device 405 or the host device 410 may be performed in a different order than the example order shown, or the operations performed by one or both of the memory device 405 or the host device 410 may be performed in different orders or at different times. Some operations may also be omitted from the signaling diagram 400, and other operations may be added to the signaling diagram 400.

At 415, the host device 410 may issue a memory access command for a memory row addresses of the memory device 405. The memory device 405 may perform the access operation (e.g., write, activate, etc.) according to the memory access command. The memory device 405 may monitor the memory access command to determine if the memory row address corresponding to the memory access is outside a refresh region of a memory bank of the memory device 405. For example, the memory device 405 may compare the memory row address with a register value (e.g., mode register value) corresponding to a maximum address value for the refresh region. The register value may be retrieved from a register (e.g., a mode register) within the memory bank corresponding to the memory row address. The memory device 405 may determine that the memory row address is outside of the refresh region. For example, the memory device 405 may determine that the memory row address is greater than the register value corresponding to the maximum address value based on the comparison.

In some cases, the host device 410 may instruct the memory device 405 to perform multiple memory access commands corresponding to multiple memory row addresses of one or more memory banks. The memory device 405 may perform access operations according to the memory access commands and monitor each memory access command to determine if a memory row address corresponding to one of the memory access commands is outside the respective refresh region of the respective memory bank corresponding to the memory row address. Accordingly, the memory device 405 may independently monitor memory accesses with respect to multiple refresh regions corresponding to each of the one or more memory banks.

At 420, the memory device 405 may update the register value by storing the memory row address associated with the memory access in the register associated with the corresponding memory bank based on determining the memory row address is outside the refresh region. In the case that the memory device 405 was instructed to perform multiple memory access commands, the memory device 405 may update multiple registers corresponding to multiple memory banks based on the monitoring of the memory access commands. Thereby, the refresh region boundaries of one or more memory banks may be increased so that each memory row address associated with each of the memory access commands is included in the refresh region of the corresponding one or more memory banks. As such, the memory device 405 may maintain an independent record for each refresh region of each memory bank to be used for processing refresh commands. At 425, the host device 410 may issue a refresh command for the memory bank indicating the memory device to refresh each memory row address of the memory bank.

At 430, the memory device 405 may retrieve (e.g., obtain, read, etc.) the register value stored in the register associated with the memory bank corresponding to a maximum memory row address (e.g., a highest memory row address) of the refresh region. The maximum memory row address may refer to the memory row address with a highest numerical address that has been previously been associated with an access command issued at the memory device 405 (e.g., since start-up). The memory device 405 may compare the maximum memory row address with a memory row address associated with the refresh command and determine the refresh region of the memory bank based on the memory row address associated with the refresh command being less than or equal to the maximum memory row address. The memory device 405 may select a first subset of the memory row addresses associated with the refresh command based on the refresh region. For example, the first subset may include each memory row address associated with the refresh command that is less than or equal to the maximum memory row address. The memory device 405 may execute a refresh command on the first subset of memory row addresses by performing a refresh operation on each memory cell corresponding to each of the memory row addresses. The memory device 405 may select a second subset of the memory row addresses associated with the refresh command. For example, the second subset may include each memory row address that is greater than or unequal to the maximum memory row address. The memory device 405 may reject the refresh command on the second subset of memory row addresses by refraining from refreshing (e.g., skipping) the second subset of memory row addresses.

At 435, the host device 410 may issue a reset command to reset the register value associated with the memory bank. At 440, the memory device 405 may receive the reset command and update the register value (e.g., a memory row address value, a memory row address range) according to the reset command. For example, the memory device 405 may null the value stored in the register of the memory bank. Accordingly, the refresh region of the memory bank may be reset to represent an unused state.

By enabling one or both of the memory device 405 or the host device 410 to support tracking access to memory row addresses of each respective memory bank associated with the memory device 405 and setting and/or adjusting a respective refresh region for each respective memory bank independently, the memory device 405 may experience increased power saving.

Figure 5:
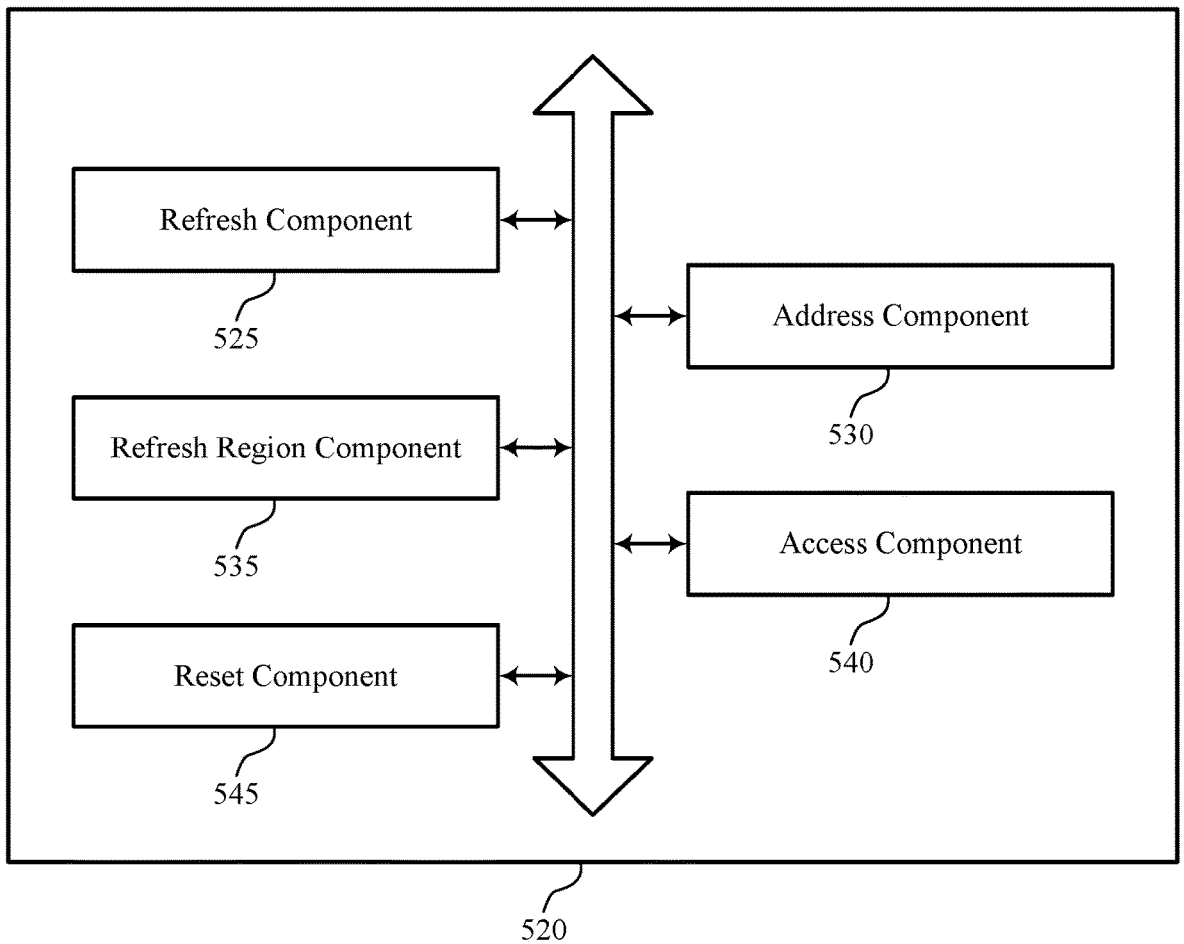
FIG. 5 shows a block diagram of a memory device that supports techniques for flexible self-refresh of memory arrays in accordance with examples as disclosed herein.

FIG. 5 shows a block diagram 500 of a memory device 520 that supports techniques for flexible self-refresh of memory arrays in accordance with examples as disclosed herein. The memory device 520 may be an example of aspects of a memory device as described with reference to FIGS. 1 through 4. The memory device 520, or various components thereof, may be an example of means for performing various aspects of techniques for flexible self-refresh of memory arrays as described herein. For example, the memory device 520 may include a refresh component 525, an address component 530, a refresh region component 535, an access component 540, a reset component 545, or any combination thereof. Each of these components may communicate, directly or indirectly, with one another (e.g., via one or more buses).

The refresh component 525 may be configured as or otherwise support a means for receiving a refresh command for a memory bank associated with a memory device, each of one or more memory row addresses of a set of memory row addresses corresponding to each of one or more memory cells of a set of memory cells associated with the memory bank. The address component 530 may be configured as or otherwise support a means for determining a value indicating a respective memory row address associated with the memory bank. The refresh region component 535 may be configured as or otherwise support a means for comparing a refresh memory row address associated with the refresh command to the respective memory row address indicated by the determined value. In some examples, the refresh component 525 may be configured as or otherwise support a means for processing the refresh command based at least in part on the comparing.

In some examples, to support determining the value, the address component 530 may be configured as or otherwise support a means for retrieving, from a register, the value indicating the respective memory row address associated with the memory bank.

In some examples, the refresh region component 535 may be configured as or otherwise support a means for determining a refresh region associated with the memory bank based at least in part on the refresh memory row address associated with the refresh command being equal to or less than the respective memory row address associated with the determined value. In some examples, the refresh region component 535 may be configured as or otherwise support a means for selecting a first subset of memory row addresses of the set of memory row addresses based at least in part on the determined refresh region, the selected first subset of memory row addresses corresponding to a first subset of memory cells of the set of memory cells associated with the memory bank. In some examples, the refresh component 525 may be configured as or otherwise support a means for processing the refresh command includes executing the refresh command for the selected first subset of memory row addresses.

In some examples, to support executing the refresh command, the refresh component 525 may be configured as or otherwise support a means for refreshing the selected first subset of memory row addresses based at least in part on the refresh command. In some examples, to support executing the refresh command, the refresh component 525 may be configured as or otherwise support a means for refraining from refreshing a second subset of memory row addresses based at least in part on the refresh command, the second subset of memory row addresses corresponding to a second subset of memory cells of the set of memory cells associated with the memory bank.

In some examples, to support refraining from refreshing the second subset of memory row addresses, the refresh component 525 may be configured as or otherwise support a means for skipping the second subset of memory row addresses during a refresh operation associated with the refresh command. In some examples, the selected first subset of memory row addresses includes two or more consecutive memory row addresses. In some examples, the selected first subset of memory row addresses includes two or more nonconsecutive memory row addresses.

In some examples, the refresh region component 535 may be configured as or otherwise support a means for determining a refresh region associated with the memory bank based at least in part on the refresh memory row address associated with the refresh command being equal to or less than the respective memory row address indicated by the determined value. In some examples, the refresh region component 535 may be configured as or otherwise support a means for selecting a first subset of memory row addresses of the set of memory row addresses based at least in part on the determined refresh region, the selected first subset of memory row addresses corresponding to a first subset of memory cells of the set of memory cells associated with the memory bank. In some examples, the refresh component 525 may be configured as or otherwise support a means for processing the refresh command includes executing the refresh command for the selected first subset of memory row addresses.

In some examples, the refresh region component 535 may be configured as or otherwise support a means for determining a refresh region associated with the memory bank based at least in part on the refresh memory row address associated with the refresh command being unequal to or greater than the respective memory row address indicated by the determined value. In some examples, the refresh component 525 may be configured as or otherwise support a means for processing the refresh command includes rejecting the refresh command. In some examples, to support rejecting the refresh command, the refresh component 525 may be configured as or otherwise support a means for refraining from refreshing each of the one or more memory row addresses of the set of memory row addresses based at least in part on the rejected refresh command.

In some examples, the access component 540 may be configured as or otherwise support a means for tracking a respective memory access for each of the one or more memory row addresses of the set of memory row addresses. In some examples, the refresh region component 535 may be configured as or otherwise support a means for setting the respective memory row address in a register based at least in part on the tracking of the respective memory access for each of the one or more memory row addresses of the set of memory row addresses. In some examples, the address component 530 may be configured as or otherwise support a means for determining the value based at least in part on the setting. In some examples, the access component 540 may be configured as or otherwise support a means for storing the set respective memory row address at the memory bank.

In some examples, the refresh region component 535 may be configured as or otherwise support a means for monitoring a respective activate command for each of the one or more memory row addresses of the set of memory row addresses. In some examples, the refresh region component 535 may be configured as or otherwise support a means for comparing the refresh memory row address associated with the refresh command based at least in part on monitoring the respective activate command for each of the one or more memory row addresses of the set of memory row addresses.

In some examples, the refresh region component 535 may be configured as or otherwise support a means for determining whether the respective memory access for each of the one or more memory row addresses of the set of memory row addresses satisfies a range of memory row addresses of the set of memory row addresses associated with the memory bank based at least in part on the comparing. In some examples, the refresh component 525 may be configured as or otherwise support a means for processing the refresh command based at least in part on determining whether the respective memory access for each of the one or more memory row addresses of the set of memory row addresses satisfies the range of memory row addresses of the set of memory row addresses associated with the memory bank.

In some examples, the reset component 545 may be configured as or otherwise support a means for receiving a command to update the value with a different respective memory row address associated with the memory bank. In some examples, the reset component 545 may be configured as or otherwise support a means for resetting the value based at least in part on the received command. In some examples, the reset component 545 may be configured as or otherwise support a means for receiving a command to reset the value associated with the memory bank, where the reset nulls the value corresponding to a range of memory row addresses of the set of memory row addresses associated with the memory bank.

In some examples, the respective memory row address corresponds to a highest memory row address of the set of memory row addresses associated with the memory bank. In some examples, the respective memory row address corresponds to a range of memory row addresses of the set of memory row addresses associated with the memory bank.

Figure 6:
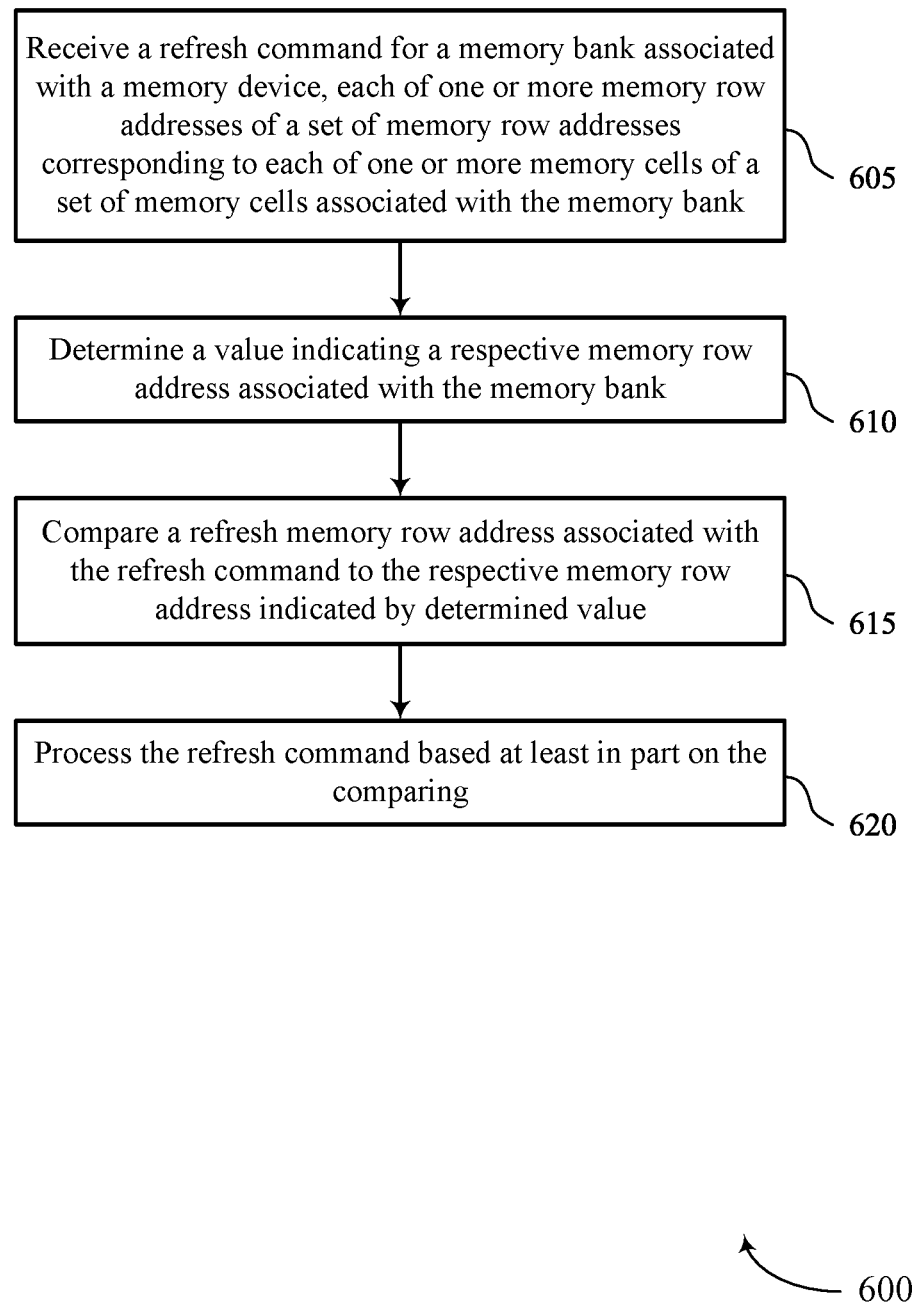
FIG. 6 shows a flowchart illustrating a method or methods that support techniques for flexible self-refresh of memory arrays in accordance with examples as disclosed herein.

FIG. 6 shows a flowchart illustrating a method 600 that supports techniques for flexible self-refresh of memory arrays in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 605, the method may include receiving a refresh command for a memory bank associated with a memory device, each of one or more memory row addresses of a set of memory row addresses corresponding to each of one or more memory cells of a set of memory cells associated with the memory bank. The operations of 605 may be performed in accordance with examples as disclosed herein. In some examples, aspects of the operations of 605 may be performed by a refresh component 525 as described with reference to FIG. 5.

At 610, the method may include determining a value indicating a respective memory row address associated with the memory bank. The operations of 610 may be performed in accordance with examples as disclosed herein. In some examples, aspects of the operations of 610 may be performed by an address component 530 as described with reference to FIG. 5.

At 615, the method may include comparing a refresh memory row address associated with the refresh command to the respective memory row address indicated by the determined value. The operations of 615 may be performed in accordance with examples as disclosed herein. In some examples, aspects of the operations of 615 may be performed by a refresh region component 535 as described with reference to FIG. 5.

At 620, the method may include processing the refresh command based at least in part on the comparing. The operations of 620 may be performed in accordance with examples as disclosed herein. In some examples, aspects of the operations of 620 may be performed by a refresh component 525 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a refresh command for a memory bank associated with a memory device, each of one or more memory row addresses of a set of memory row addresses corresponding to each of one or more memory cells of a set of memory cells associated with the memory bank; determining a value indicating a respective memory row address associated with the memory bank; comparing a refresh memory row address associated with the refresh command to the respective memory row address indicated by the determined value; and processing the refresh command based at least in part on the comparing.

Aspect 2: The method, apparatus, or non-transitory computer-readable medium of aspect 1 where determining the value includes operations, features, circuitry, logic, means, or instructions, or any combination thereof for retrieving, from a register, the value indicating the respective memory row address associated with the memory bank.

Aspect 3: The method, apparatus, or non-transitory computer-readable medium of any of aspects 1 through 2, further including operations, features, circuitry, logic, means, or instructions, or any combination thereof for determining a refresh region associated with the memory bank based at least in part on the refresh memory row address associated with the refresh command being equal to or less than the respective memory row address associated with the determined value; selecting a first subset of memory row addresses of the set of memory row addresses based at least in part on the determined refresh region, the selected first subset of memory row addresses corresponding to a first subset of memory cells of the set of memory cells associated with the memory bank; and where processing the refresh command includes executing the refresh command for the selected first subset of memory row addresses.

Aspect 4: The method, apparatus, or non-transitory computer-readable medium of aspect 3 where executing the refresh command includes operations, features, circuitry, logic, means, or instructions, or any combination thereof for refreshing the selected first subset of memory row addresses based at least in part on the refresh command and refraining from refreshing a second subset of memory row addresses based at least in part on the refresh command, the second subset of memory row addresses corresponding to a second subset of memory cells of the set of memory cells associated with the memory bank.

Aspect 5: The method, apparatus, or non-transitory computer-readable medium of aspect 4 where refraining from refreshing the second subset of memory row addresses includes operations, features, circuitry, logic, means, or instructions, or any combination thereof for skipping the second subset of memory row addresses during a refresh operation associated with the refresh command.

Aspect 6: The method, apparatus, or non-transitory computer-readable medium of any of aspects 3 through 5 where the selected first subset of memory row addresses includes two or more consecutive memory row addresses.

Aspect 7: The method, apparatus, or non-transitory computer-readable medium of any of aspects 3 through 6 where the selected first subset of memory row addresses includes two or more nonconsecutive memory row addresses.

Aspect 8: The method, apparatus, or non-transitory computer-readable medium of any of aspects 1 through 7, further including operations, features, circuitry, logic, means, or instructions, or any combination thereof for determining a refresh region associated with the memory bank based at least in part on the refresh memory row address associated with the refresh command being equal to or less than the respective memory row address indicated by the determined value; selecting a first subset of memory row addresses of the set of memory row addresses based at least in part on the determined refresh region, the selected first subset of memory row addresses corresponding to a first subset of memory cells of the set of memory cells associated with the memory bank; and where processing the refresh command includes executing the refresh command for the selected first subset of memory row addresses.

Aspect 9: The method, apparatus, or non-transitory computer-readable medium of any of aspects 1 through 8, further including operations, features, circuitry, logic, means, or instructions, or any combination thereof for determining a refresh region associated with the memory bank based at least in part on the refresh memory row address associated with the refresh command being unequal to or greater than the respective memory row address indicated by the determined value and where processing the refresh command includes rejecting the refresh command.

Aspect 10: The method, apparatus, or non-transitory computer-readable medium of aspect 9 where rejecting the refresh command includes operations, features, circuitry, logic, means, or instructions, or any combination thereof for refraining from refreshing each of the one or more memory row addresses of the set of memory row addresses based at least in part on the rejected refresh command.

Aspect 11: The method, apparatus, or non-transitory computer-readable medium of any of aspects 1 through 10, further including operations, features, circuitry, logic, means, or instructions, or any combination thereof for tracking a respective memory access for each of the one or more memory row addresses of the set of memory row addresses; setting the respective memory row address in a register based at least in part on the tracking of the respective memory access for each of the one or more memory row addresses of the set of memory row addresses; and where determining the value is further based at least in part on the setting.

Aspect 12: The method, apparatus, or non-transitory computer-readable medium of aspect 11, further including operations, features, circuitry, logic, means, or instructions, or any combination thereof for storing the set respective memory row address at the memory bank.

Aspect 13: The method, apparatus, or non-transitory computer-readable medium of any of aspects 11 through 12, further including operations, features, circuitry, logic, means, or instructions, or any combination thereof for monitoring a respective activate command for each of the one or more memory row addresses of the set of memory row addresses and where comparing the refresh memory row address associated with the refresh command is further based at least in part on monitoring the respective activate command for each of the one or more memory row addresses of the set of memory row addresses.

Aspect 14: The method, apparatus, or non-transitory computer-readable medium of aspect 13, further including operations, features, circuitry, logic, means, or instructions, or any combination thereof for determining whether the respective memory access for each of the one or more memory row addresses of the set of memory row addresses satisfies a range of memory row addresses of the set of memory row addresses associated with the memory bank based at least in part on the comparing and where processing the refresh command is further based at least in part on determining whether the respective memory access for each of the one or more memory row addresses of the set of memory row addresses satisfies the range of memory row addresses of the set of memory row addresses associated with the memory bank.

Aspect 15: The method, apparatus, or non-transitory computer-readable medium of any of aspects 1 through 14, further including operations, features, circuitry, logic, means, or instructions, or any combination thereof for receiving a command to update the value with a different respective memory row address associated with the memory bank and resetting the value based at least in part on the received command.

Aspect 16: The method, apparatus, or non-transitory computer-readable medium of any of aspects 1 through 15, further including operations, features, circuitry, logic, means, or instructions, or any combination thereof for receiving a command to reset the value associated with the memory bank, where the reset nulls the value corresponding to a range of memory row addresses of the set of memory row addresses associated with the memory bank.

Aspect 17: The method, apparatus, or non-transitory computer-readable medium of any of aspects 1 through 16 where the respective memory row address corresponds to a highest memory row address of the set of memory row addresses associated with the memory bank.

Aspect 18: The method, apparatus, or non-transitory computer-readable medium of any of aspects 1 through 17 where the respective memory row address corresponds to a range of memory row addresses of the set of memory row addresses associated with the memory bank.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial materials of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" may not be construed as a reference to a closed set of conditions. For example, an exemplary step that is described as "based on condition A" may be based on both a condition A and a condition B without departing from the scope of the present disclosure. In other words, as used herein, the phrase "based on" may be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    receiving a refresh command for a memory bank associated with a memory device, each of one or more memory row addresses of a set of memory row addresses corresponding to each of one or more memory cells of a set of memory cells associated with the memory bank;
    determining a value indicating a respective memory row address associated with the memory bank, the respective memory row address corresponding to a range of memory row addresses of the set of memory row addresses associated with the memory bank;
    comparing a refresh memory row address associated with the refresh command to the respective memory row address indicated by the determined value; and
    processing the refresh command based at least in part on the comparing.

2. The method of claim 1, wherein determining the value comprises:
    retrieving, from a register, the value indicating the respective memory row address associated with the memory bank.

3. The method of claim 1, further comprising:
    determining a refresh region associated with the memory bank based at least in part on the refresh memory row address associated with the refresh command being equal to or less than the respective memory row address associated with the determined value; and selecting a first subset of memory row addresses of the set of memory row addresses based at least in part on the determined refresh region, the selected first subset of memory row addresses corresponding to a first subset of memory cells of the set of memory cells associated with the memory bank, wherein processing the refresh command comprises executing the refresh command for the selected first subset of memory row addresses.

4. The method of claim 3, wherein executing the refresh command comprises:

refreshing the selected first subset of memory row addresses based at least in part on the refresh command; and refraining from refreshing a second subset of memory row addresses based at least in part on the refresh command, the second subset of memory row addresses corresponding to a second subset of memory cells of the set of memory cells associated with the memory bank.

5. The method of claim 4, wherein refraining from refreshing the second subset of memory row addresses comprises:

skipping the second subset of memory row addresses during a refresh operation associated with the refresh command.

6. The method of claim 3, wherein the selected first subset of memory row addresses comprises two or more consecutive memory row addresses.

7. The method of claim 3, wherein the selected first subset of memory row addresses comprises two or more nonconsecutive memory row addresses.

8. The method of claim 1, further comprising:

determining a refresh region associated with the memory bank based at least in part on the refresh memory row address associated with the refresh command being equal to or less than the respective memory row address indicated by the determined value; and selecting a first subset of memory row addresses of the set of memory row addresses based at least in part on the determined refresh region, the selected first subset of memory row addresses corresponding to a first subset of memory cells of the set of memory cells associated with the memory bank, wherein processing the refresh command comprises executing the refresh command for the selected first subset of memory row addresses.

9. The method of claim 1, further comprising:

determining a refresh region associated with the memory bank based at least in part on the refresh memory row address associated with the refresh command being unequal to or greater than the respective memory row address indicated by the determined value, wherein processing the refresh command comprises rejecting the refresh command.

10. The method of claim 9, wherein rejecting the refresh command comprises:

refraining from refreshing each of the one or more memory row addresses of the set of memory row addresses based at least in part on the rejected refresh command.

11. A method, comprising:

tracking a respective memory access for each of one or more memory row addresses of a set of memory row addresses;

setting the respective memory row address in a register based at least in part on the tracking of the respective memory access for each of the one or more memory row addresses of the set of memory row addresses;

receiving a refresh command for a memory bank associated with a memory device, each of the one or more memory row addresses of the set of memory row addresses corresponding to respective one or more memory cells of a set of memory cells associated with the memory bank;

determining a value indicating a respective memory row address associated with the memory bank based at least in part on the setting;

comparing a refresh memory row address associated with the refresh command to the respective memory row address indicated by the determined value; and processing the refresh command based at least in part on the comparing.

12. The method of claim 11, further comprising:

storing the set respective memory row address at the memory bank.

13. The method of claim 11, further comprising:

monitoring a respective activate command for each of the one or more memory row addresses of the set of memory row addresses, wherein comparing the refresh memory row address associated with the refresh command is further based at least in part on monitoring the respective activate command for each of the one or more memory row addresses of the set of memory row addresses.

14. The method of claim 13, further comprising:

determining whether the respective memory access for each of the one or more memory row addresses of the set of memory row addresses satisfies a range of memory row addresses of the set of memory row addresses associated with the memory bank based at least in part on the comparing, wherein processing the refresh command is further based at least in part on determining whether the respective memory access for each of the one or more memory row addresses of the set of memory row addresses satisfies the range of memory row addresses of the set of memory row addresses associated with the memory bank.

15. A method, comprising:

receiving a refresh command for a memory bank associated with a memory device, each of one or more memory row addresses of a set of memory row addresses corresponding to respective one or more memory cells of a set of memory cells associated with the memory bank;

determining a value indicating a respective memory row address associated with the memory bank;

comparing a refresh memory row address associated with the refresh command to the respective memory row address indicated by the determined value;

processing the refresh command based at least in part on the comparing;

receiving a command to update the value with a different respective memory row address associated with the memory bank; and resetting the value based at least in part on the received command.

16. The method of claim 1, further comprising:

receiving a command to reset the value associated with the memory bank, wherein the reset nulls the value corresponding to the range of memory row addresses of the set of memory row addresses associated with the memory bank.

17. A method, comprising:
receiving a refresh command for a memory bank associated with a memory device, each of one or more memory row addresses of a set of memory row addresses corresponding to respective one or more memory cells of a set of memory cells associated with the memory bank;
determining a value indicating a respective memory row address associated with the memory bank, wherein the respective memory row address corresponds to a highest memory row address of the set of memory row addresses associated with the memory bank;
comparing a refresh memory row address associated with the refresh command to the respective memory row address indicated by the determined value; and
processing the refresh command based at least in part on the comparing.

18. A non-transitory computer-readable medium storing code, the code comprising instructions executable by a processor to:
receive a refresh command for a memory bank associated with a memory device, each of one or more memory row addresses of a set of memory row addresses corresponding to each of one or more memory cells of a set of memory cells associated with the memory bank;
determine a value indicating a respective memory row address associated with the memory bank, wherein the respective memory row address corresponds to a range of memory row addresses of the set of memory row addresses associated with the memory bank;
compare a refresh memory row address associated with the refresh command to the respective memory row address indicated by the determined value; and
process the refresh command based at least in part on the comparing.

19. An apparatus, comprising:
a controller associated with a memory device, wherein the controller is configured to cause the apparatus to:
receive a refresh command for a memory bank associated with the memory device, each of one or more memory row addresses of a set of memory row addresses corresponding to each of one or more memory cells of a set of memory cells associated with the memory bank;
determine a value indicating a respective memory row address associated with the memory bank, wherein the respective memory row address corresponds to a range of memory row addresses of the set of memory row addresses associated with the memory bank;
compare a refresh memory row address associated with the refresh command to the respective memory row address indicated by the determined value; and
process the refresh command based at least in part on the comparing.

* * * * *